United States Patent

Tseng

[11] Patent Number: 6,140,178
[45] Date of Patent: Oct. 31, 2000

[54] METHOD TO MANUFACTURE A CAPACITOR WITH CROWN-SHAPE USING EDGE CONTACT EXPOSURE

[75] Inventor: Horng-Huei Tseng, Hsinchu, Taiwan

[73] Assignee: Vanguard International Semiconductor Corporation, Hsinchu, Taiwan

[21] Appl. No.: 09/287,562

[22] Filed: Apr. 6, 1999

[51] Int. Cl.[7] .............................................. H01L 21/8242
[52] U.S. Cl. ........................................... 438/253; 438/255
[58] Field of Search .................... 438/3, 238–240, 438/250–256, 381, 393–399

[56] References Cited

U.S. PATENT DOCUMENTS 5,488,011  1/1996  Figura et al. .
5,858,837  1/1999  Sakoh et al. ............................. 438/255
5,953,608  9/1999  Hirota ..................................... 438/253
5,994,181  11/1999  Hsieh et al. ............................. 438/239

*Primary Examiner*—Jey Tsai
*Attorney, Agent, or Firm*—Bacon & Thomas

[57] ABSTRACT

The present invention provides a method to manufacture a capacitor on a memory device. The capacitor formed on the memory device will only edge contacted with the related region, so a symmetrical formation of the capacitor to the related region of the memory device is not necessary, the manufacturing processes are therefore simplified to save the cost.

12 Claims, 5 Drawing Sheets

METHOD TO MANUFACTURE A
CAPACITOR WITH CROWN-SHAPE USING
EDGE CONTACT EXPOSURE

FIELD OF THE INVENTION

The present invention relates to a method to manufacture a capacitor on a memory device, and more particularly to a method to manufacture a capacitor with crown-shape on a memory device. The capacitor can be unsymmetrical to the memory device, so as to decrease the steps in related manufacturing process, reduce the cost, increase the capacitance, and reduce the area occupied by the capacitor.

BACKGROUND OF THE INVENTION

Conventional method to manufacture a capacitor on a memory device (e.g. DRAM) is shown in FIG. 1. The processes are described from top to bottom in FIG. 1, wherein a source 2 (or drain) of a transistor is formed in a wafer substrate 1 first, and then a layer of dielectric 3 is deposited on top of the substrate 1, followed by etching through the dielectric 3 on top of the source 2 to form a node contact hole 4, polysilicon 41 is then filled into the node contact hole 4, followed by steps to form a electrode 5 of the capacitor, the dielectric 6, and the other electrode 7 of the capacitor. However, the above method makes the capacitor occupy too much area, and can not increase the capacitance.

In order to reduce the area occupied by the capacitor and increase the capacitance, a capacitor with crown-shape is adopted. As shown in FIG. 2, the electrode 5 of the capacitor is formed into a cylinder with crown-shape, the dielectric 6 and the other electrode 7 are then deposited on top of the electrode 5 sequentially so as to increase the electrode area of the capacitor, raise the capacitance, and reduce the area occupied by the capacitor.

However, the capacitor formed by the method shown in FIG. 2 is generally symmetrical to the node contact hole 4, which makes the manufacturing process very complicated and the cost is therefore increased.

SUMMARY OF THE INVENTION

It is therefore an object of the present invention to provide a method for forming a capacitor on a memory device, such that a electrode of the capacitor will connect with the memory device by edge contact only. Thus the capacitor can be unsymmetrical to the memory device, so as to save the manufacture processes, and reduce the cost.

It is another object of the present invention to form the capacitor into a crown shape, the whole surface of one electrode of the capacitor can be formed into a hemi-spherical-grain type, so as to increase the capacitance, and reduce the area occupied by the capacitor.

BRIEF DESCRIPTION OF THE DRAWINGS

The present invention will be better understood with the following drawings, in which.

DETAILED DESCRIPTION OF THE PREFERRED EMBODIMENT

The processes for forming a capacitor on a memory device according to the present invention are shown in FIGS. 3~12.

Figure 1:
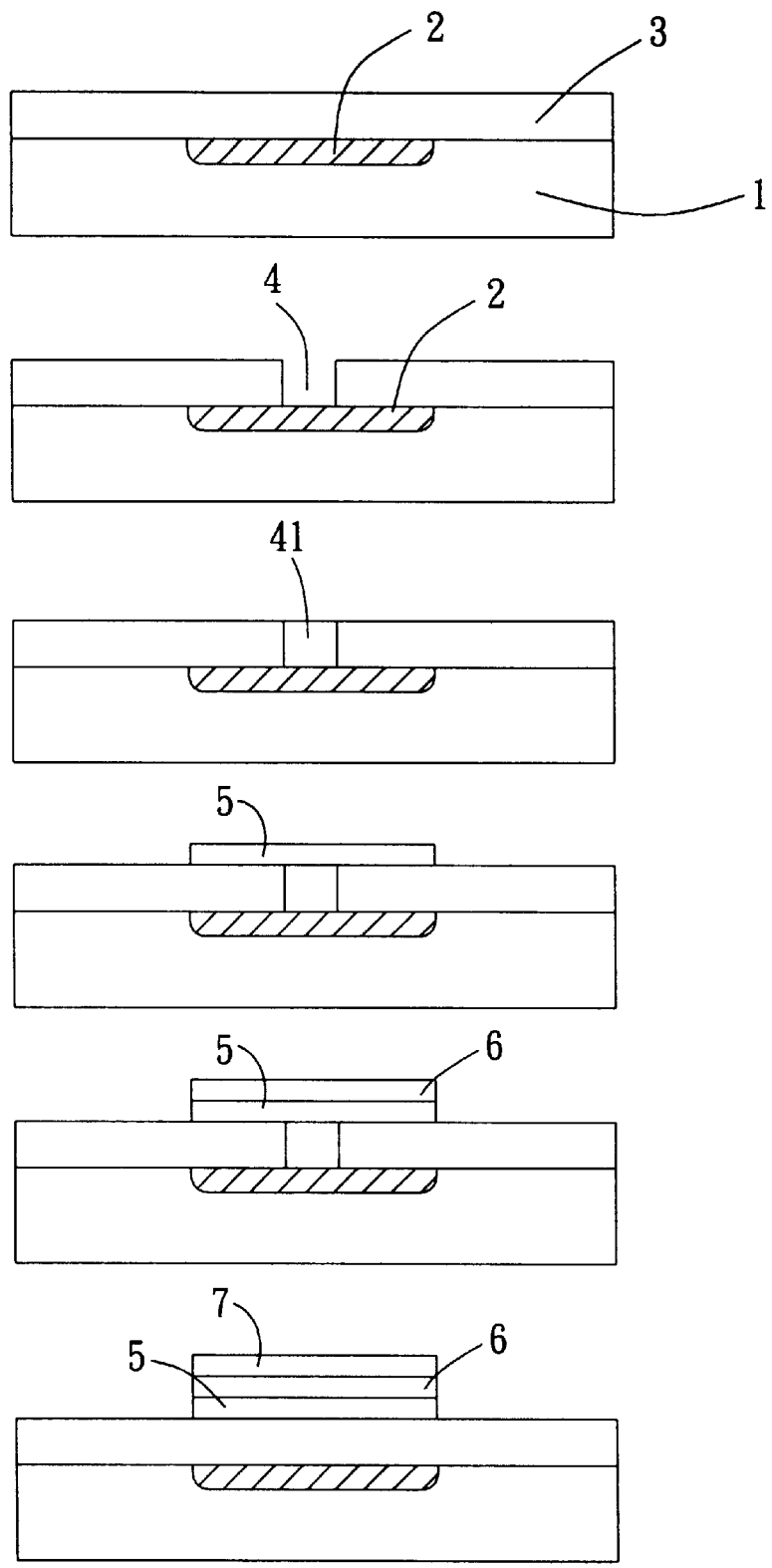
FIG. 1 shows the conventional method for forming a capacitor on a memory device.
Figure 2:
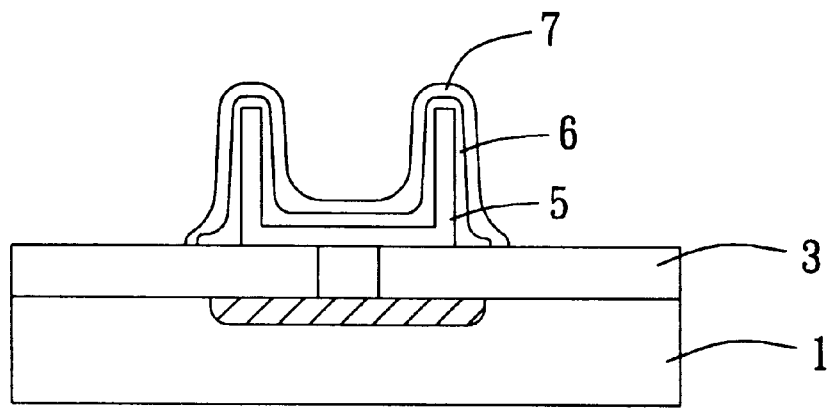
FIG. 2 shows the conventional method for forming a capacitor with crown-shape on a memory device.
Figure 3:
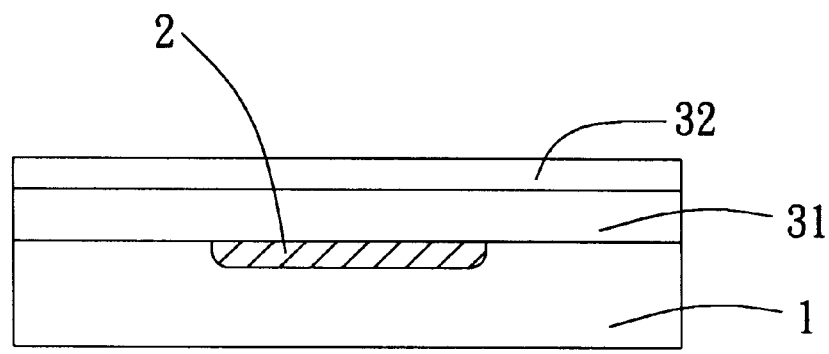
FIGS. 3~12 show the steps for forming a capacitor with crown-shape on a memory device according to the present invention.

Referring to FIG. 3, a wafer substrate 1 is provided first. After a source (or drain) 2 of a transistor is formed below the surface of the substrate 1, a layer of the first dielectric 31 (e.g. $SiO_2$) and a layer of the second dielectric 32 (e.g. $Si_3N_4$) are deposited on the top surface of the substrate 1 sequentially. The step to deposit the second dielectric 32 can be omitted.

Figure 4:
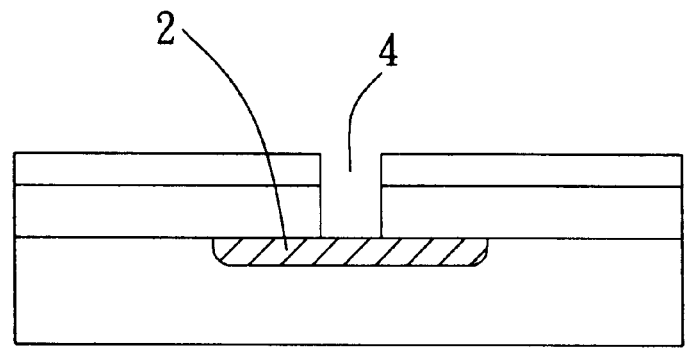
Figure 5:
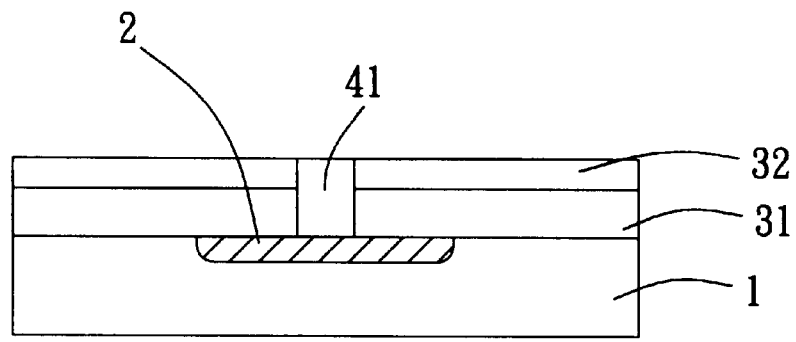

Referring to FIG. 4, a node contact hole 4 is formed by plasma etching of the first dielectric 31 and the second dielectric 32 above the source 2, and then a layer of the first polysilicon (with thickness 500~3000 Å) is deposited on the second dielectric 32 to fill up the node contact hole 4 to form a polysilicon plug 41 therein. Using chemical-mechanical polishing (CMP) to remove the polysilicon outside the node contact hole 4, and the structure of FIG. 5 is formed.

Figure 6:
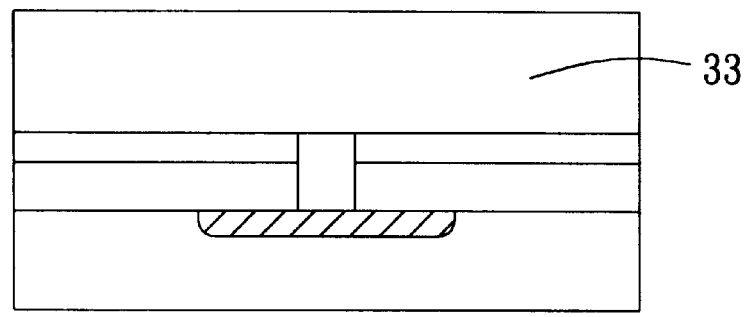
Figure 7:
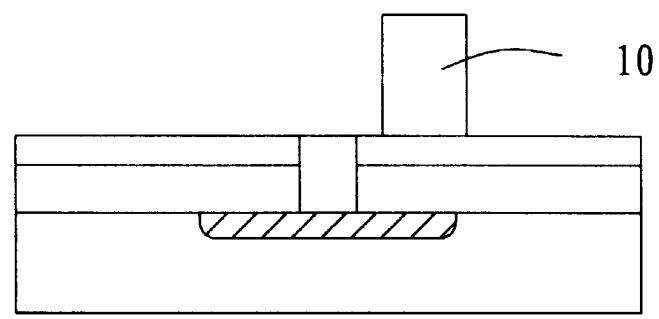

Referring to FIG. 6, a layer of the third dielectric 33 with thickness of 3000~12000 Å is deposited on top surface of the second dielectric 32 and the polysilicon plug 41, followed by plasma etching of the third dielectric 33 to form a dielectric mesa 10 near the polysilicon plug 41, as shown in FIG. 7. The third dielectric 33 can be a porous oxide, a doped oxide, a doped SOG, or an $O_3$-TEOS oxide, since these materials can be etched rapidly in HF solution, and HF solution can't almost etch away the second dielectric 32.

Figure 8:
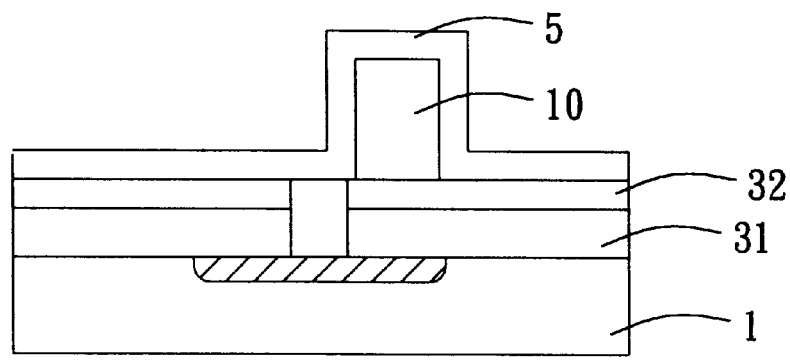
Figure 9:
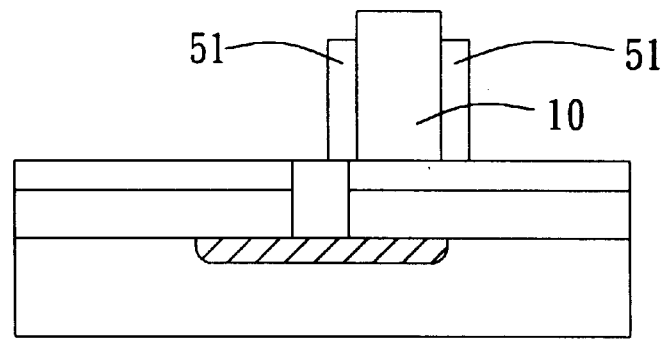
Figure 10:
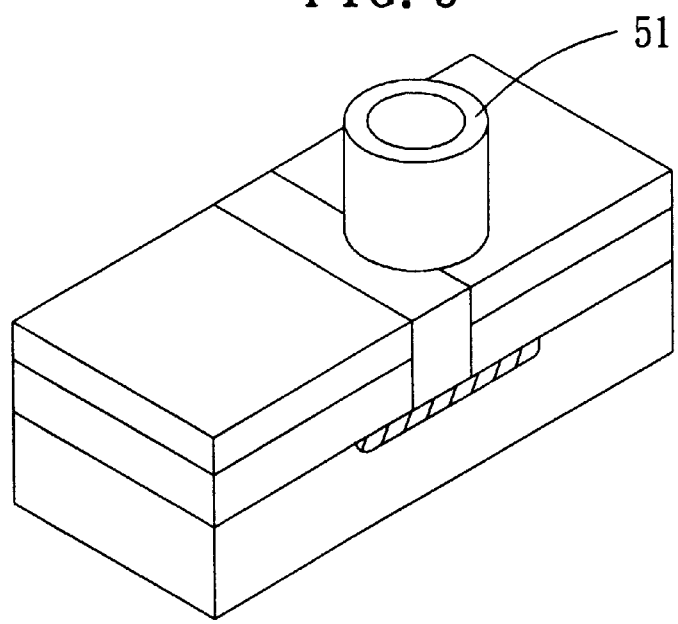

Referring to FIG. 8, a layer of the second polysilicon 5 is deposited with thickness 500~3000 Å to cover the mesa 10, and then using anisotropic plasma etching to etch the layer of the second polysilicon 5, the structure of FIG. 9 is therefore formed. The second polysilicon remains only around the peripheral of the mesa 10 and forms a polysilicon spacer 51. The mesa 10 is then etched away by HF solution so as to form a structure as shown in FIG. 10. The polysilicon spacer 51 will be used as one electrode of the capacitor.

Figure 11:
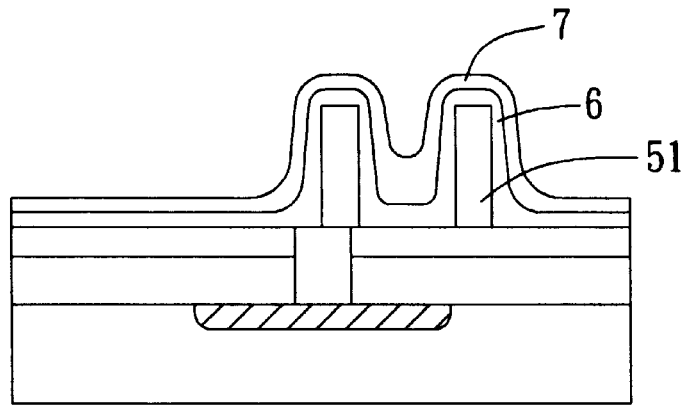
Figure 12:
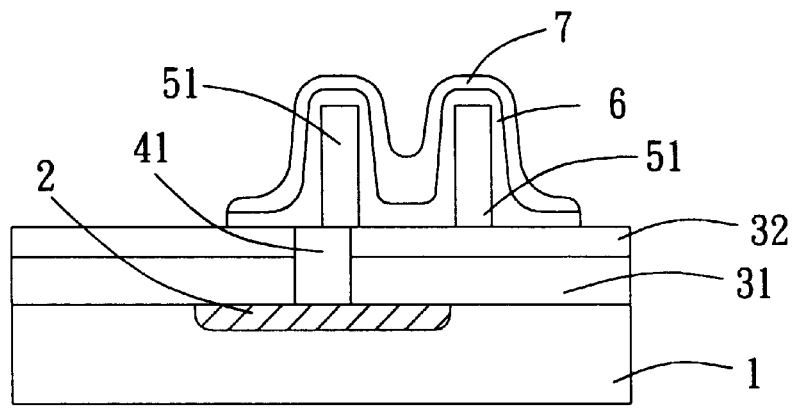

Referring to FIG. 11, a layer of a capacitor dielectric 6 is deposited to cover the polysilicon spacer 51, then a layer of the third polysilicon 7 is deposited to cover the capacitor dielectric 6. After etching away the unnecessary third polysilicon 7 and capacitor dielectric 6, a capacitor is formed on the polisilicon plug 41, as shown in FIG. 12. The capacitor dielectric 6 deposited can be NO, ONO, or $Ta_2O_5$ which are materials of high dielectric constant.

One electrode of the capacitor is the polysilicon spacer 51, which is just edge contacted with the polysilicon plug 41. The conventional symmetric formation of the capacitor to the node contact hole is not necessary according to the present invention, so the accuracy of the position of the mesa 10 can be lowered to simplify the process and reduce the cost.

Figure 13:
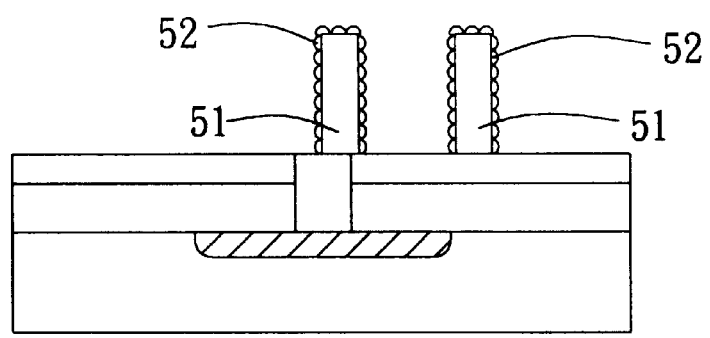
FIG. 13 shows the schematic diagram of the capacitor in which the whole surface of one electrode of the capacitor is formed into a hemi-spherical-grain type according to the present invention.

Referring to FIG. 13, if the capacitance of the capacitor is not high enough, the surface of the polysilicon spacer 51 can be formed into a hemi-spherical-grain type 52 by a conventional method to further increase the area and the capacitance.

It is no doubt that after reading the above descriptions any skillful person in the art can create many different variations without departing the spirit and scope of the accompanying claims. Therefore, it is intended that the appended claims will cover all those variations.

What is claimed is:

1. A method to form a capacitor on a memory device, comprising the steps of:

a) providing a semiconductor substrate to form a transistor therein, when a capacitor is to be formed on said substrate to contact with one region of said transistor, a layer of the first dielectric is deposited on said region, and then planarizing the surface of said first dielectric;

b) depositing a layer of the second dielectric on said first dielectric, and then planarizing the surface of said second dielectric;

c) etching through said first dielectric and said second dielectric to form a node contact hole above said region;

d) depositing a layer of the first polysilicon on said second dielectric to fill up said node contact hole, and then remove the remaining polysilicon on top of said second dielectric so as to form a polysilicon plug in said node contact hole;

e) depositing a layer of the third dielectric on said second dielectric and said polysilicon plug;

f) etching said third dielectric to form a dielectric mesa near said polysilicon plug;

g) depositing a layer of the second polysilicon to cover said dielectric mesa;

h) etching said layer of the second polysilicon so that only the peripheral of said mesa will be wrapped with said second polysilicon which forms a polysilicon spacer a one electrode of the capacitor, and wherein only an edge of said spacer is in contact with said polysilicon plug;

i) etching away said mesa completely;

j) depositing a layer of capacitor dielectric to cover said polysilicon spacer;

k) depositing a layer of the third polysilicon to cover said capacitor dielectric;

l) etching away unnecessary said third polysilicon and said capacitor dielectric to form a capacitor on said polysilicon plug.

2. The method according to claim 1, wherein the whole surface of said polysilicon spacer can be formed into a hemi-spherical-grain type after step i).

3. The method according to claim 1, wherein a chemical mechanical polishing process is used to planarize said dielectrics in step a) and b).

4. The method according to claim 1, wherein a chemical mechanical polishing process is used to remove said first polysilicon.

5. The method according to claim 1, wherein HF solution is used to etching away said mesa.

6. The method according to claim 1, wherein the thickness of said first polysilicon deposited in step d) is 500~3000 Å.

7. The method according to claim 1, wherein the thickness of said third dielectric deposited in step e) is 3000~12000 Å, and said third dielectric can be selected from a group consisting of porous oxide, doped oxide, doped SOG, and $O_3$-TEOS oxide.

8. The method according to claim 1, wherein the thickness of said second polysilicon deposited in step g) is 500~3000 Å.

9. The method according to claim 1, wherein said capacitor dielectric deposited in step j) can be selected from a group consisting of NO, ONO, and $Ta_2O_5$.

10. The method according to claim 1, wherein a plasma etching is used to form said node contact hole in step c).

11. The method according to claim 1, wherein a plasma etching is used to remove said third dielectric in step f).

12. The method according to claim 1, wherein an anisotropic plasma etching is used to etch said second polysilicon in step h).

* * * * *